(12) United States Patent
Liu et al.

(10) Patent No.: US 7,102,017 B2
(45) Date of Patent: Sep. 5, 2006

(54) PROCESSES TO PREPARE SMALL MOLECULAR THIOPHENE COMPOUNDS

(75) Inventors: Ping Liu, Mississauga (CA); Yiliang Wu, Mississauga (CA); Beng S. Ong, Mississauga (CA); Maria Birau, Mississauga (CA)

(73) Assignee: Xerox Corporation, Stamford, CT (US)

( * ) Notice: Subject to any disclaimer, the term of this patent is extended or adjusted under 35 U.S.C. 154(b) by 253 days.

(21) Appl. No.: 10/865,029

(22) Filed: Jun. 10, 2004

(65) Prior Publication Data

US 2005/0277776 A1 Dec. 15, 2005

(51) Int. Cl.
*C07D 409/00* (2006.01)

(52) U.S. Cl. .................................... 549/59

(58) Field of Classification Search ............ 549/59
See application file for complete search history.

(56) References Cited

U.S. PATENT DOCUMENTS

| | | | |
|---|---|---|---|
| 5,705,826 A | 1/1998 | Aratani et al. ............. 257/40 |
| 6,621,099 B1 | 9/2003 | Ong et al. ................. 257/40 |
| 6,825,358 B1 * | 11/2004 | Afzali-Ardakani et al. ... 549/59 |
| 6,878,801 B1 * | 4/2005 | Fujiki et al. ............. 528/380 |
| 6,890,715 B1 * | 5/2005 | Lewis et al. ............. 435/6 |
| 6,936,190 B1 * | 8/2005 | Yoshida ................. 252/511 |
| 7,014,796 B1 * | 3/2006 | Jen et al. ................ 252/582 |
| 7,015,336 B1 * | 3/2006 | Reed et al. ............. 549/59 |
| 7,029,606 B1 * | 4/2006 | Dalton et al. ........... 252/582 |
| 2003/0160230 A1 | 8/2003 | Ong et al. ............... 257/20 |
| 2003/0160234 A1 | 8/2003 | Ong et al. ............... 257/40 |

FOREIGN PATENT DOCUMENTS

| | | |
|---|---|---|
| EP | 1 329 474 A1 | 7/2003 |
| EP | 1 329 475 A1 | 7/2003 |
| EP | 1 329 476 A1 | 7/2003 |
| WO | WO 02/09201 A1 | 1/2002 |

OTHER PUBLICATIONS

Beng S. Ong et al., U.S. Appl. No. unavailable filed on the same day as the present application, titled "Device With Small Molecular Thiophene Compound.".

Beng S. Ong et al., U.S. Appl. No. unavailable filed on the same day as the present application, titled "Device With Small Molecular Thiophene Compound Having Divalent Linkage.".

Tsuyoshi Izumi et al., "Synthesis and Spectroscopic Properties of a Series of Beta-Blocked Long Oligothiophenes up to the 96 mer: Revaluation of Effective Conjugation Length," *J. Am. Chem. Soc.*, vol. 125, No. 18, pp. 5286-5287 and S1-S6 (Apr. 10, 2003).

Francis Garnier et al., "Molecular Engineering of Organic Semiconductors: Design of Self-Assembly Properties in Conjugated Thiophene Oligomers," *J.Am.Chem. Soc.*, vol. 115, No. 19, pp. 8716-8721 (1993).

Howard Katz et al., "Synthesis, Solubility, and Field-Effect Mobility of Elongated and Oxa-Substituted alpha, omega-Dialkyl Thiophene Oligomers. Extension of 'Polar Intermediate' Synthetic Strategy and Solution Deposition on Transistor Substrates," *Chem. Mater.*, vol. 10, No. 2, pp. 633-638 (1998).

V.M. Niemi et al., "Polymerization of 3-alkylthiophenes with $FeCl_3$," *Polymer*, vol. 33, No. 7, pp. 1559-1562 (1992).

A. Afzali et al., "An Efficient Synthesis of Symmetrical Oligothiophenes: Synthesis and Transport Properties of a Soluble Sexithiophene Derivative," *Chem. Mater.*, vol. 14, No. 4, pp. 1742-1746 (Mar. 6, 2002).

X. Michael Hong et al., "Thiophene-Phenylene and Thiophene-Thiazole Oligomeric Semiconductors with High Field-Effect Transistor On/Off Ratios," Chem. Mater., vol. 13, No.12, pp. 4686-4691 (2001).

\* cited by examiner

*Primary Examiner*—Deborah C. Lambkin
(74) *Attorney, Agent, or Firm*—Zosan Soong

(57) ABSTRACT

A process composed of subjecting a reaction mixture comprising a reaction medium, a coupling agent, and a precursor to a coupling temperature to preferentially form a desired small molecular thiophene compound in a single-step synthesis, wherein the precursor consists of: (i) an optional divalent linkage, and (ii) a plurality of thiophene units, each thiophene unit being represented by structure (A)

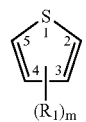

(A)

wherein each thiophene unit is bonded at either or both of the second ring position and the fifth ring position.

24 Claims, 2 Drawing Sheets

PROCESSES TO PREPARE SMALL MOLECULAR THIOPHENE COMPOUNDS

STATEMENT REGARDING FEDERALLY SPONSORED RESEARCH OR DEVELOPMENT

This invention was made with United States Government support under Cooperative Agreement No. 70NAN-BOH3033 awarded by the National Institute of Standards and Technology (NIST). The United States Government has certain rights in the invention.

CROSS-REFERENCE TO RELATED APPLICATIONS

Beng S. Ong et al., U.S. application Ser. No. 10/865,445, filed on the same day as the present application, titled "DEVICE WITH SMALL MOLECULAR THIOPHENE COMPOUND."

Beng S. Ong et al., US application Ser. No. 10/865,620, filed on the same day as the present application, titled "DEVICE WITH SMALL MOLECULAR THIOPHENE COMPOUND HAVING DIVALENT LINKAGE."

BACKGROUND OF THE INVENTION

Organic semiconductor compounds are central to the low-cost manufacturing of organic thin film transistors ("TFTs"). However, many organic semiconductor compounds suffer from either difficulties in processing in solution and/or instability in ambient conditions. In addition, certain conventional synthetic processes for preparing these organic semiconductor compounds involve multi-step reaction routes of relatively low overall yields. Thus, there is a need addressed by embodiments of the present invention for organic TFTs which incorporate organic semiconductor compounds that are solution processable and/or exhibit good stability in ambient environmental conditions. Furthermore, the present invention in embodiments provides a new process for preparing certain organic semiconductor compounds that involves fewer reaction steps and provides a higher overall yield, as compared with conventional processes.

In the literature, the term "oligomer" may convey two different definitions: one refers to a mixture of low-molecular weight compounds which consist of small numbers of repeating units of one or more chemical entities, and is therefore a subset of a polymer. The oligomer under this definition is generally characterized by number-average and weight-average molecular weights. A polymer refers to a mixture of high molecular-weight compounds consisting of large numbers of repeating units of one or more chemical entities. The distinction of low and high molecular weights to distinguish oligomer and polymer has not been clearly drawn. The other definition of "oligomer" refers to a low molecular-weight compound consisting of a specific number of repeating units of one or more chemical entities, and it is therefore characterized by a specific molecular weight. Every molecule of the oligomer under this definition is identical in all respects. We use the term "small molecular compound" to describe this class of oligomers to avoid confusion.

The following documents provide background information:

Marks et al., WO 02/09201 A1.
Aratani et al., U.S. Pat. No. 5,705,826.

Tsuyoshi Izumi et al., "Synthesis and Spectroscopic Properties of a Series of Beta-Blocked Long Oligothiophenes up to the 96 mer: Revaluation of Effective Conjugation Length," *J. Am. Chem. Soc.*, Vol. 125, No. 18, pp. 5286–5287 and S1–S6 (Apr. 10, 2003).

Francis Garnier et al., "Molecular Engineering of Organic Semiconductors: Design of Self-Assembly Properties in Conjugated Thiophene Oligomers," *J. Am. Chem. Soc.*, Vol. 115, No. 19, pp. 8716–8721 (1993).

Howard Katz et al., "Synthesis, Solubility, and Field-Effect Mobility of Elongated and Oxa-Substituted alpha, omega-Dialkyl Thiophene Oligomers. Extension of 'Polar Intermediate' Synthetic Strategy and Solution Deposition on Transistor Substrates," *Chem. Mater.*, Vol. 10, No. 2, pp. 633–638 (1998).

V. M. Niemi et al., "Polymerization of 3-alkylthiophenes with $FeCl_3$," *Polymer*, Vol. 33, No. 7, pp. 1559–1562 (1992).

A. Afzali et al., "An Efficient Synthesis of Symmetrical Oligothiophenes: Synthesis and Transport Properties of a Soluble Sexithiophene Derivative," *Chem. Mater.*, Vol. 14, No. 4, pp. 1742–1746 (Mar. 6, 2002).

X. Michael Hong et al., "Thiophene-Phenylene and Thiophene-Thiazole Oligomeric Semiconductors with High Field-Effect Transistor On/Off Ratios," Chem. Mater., Vol. 13, No. 12, pp. 4686–4691 (2001).

Beng Ong et al., U.S. application Ser. No. 10/042,358 (Attorney Docket No. D/A1332), filed Jan. 11, 2002, titled "POLYTHIOPHENES AND DEVICES THEREOF," which has been published as US Published Application 2003/0160230.

Beng Ong et al., U.S. application Ser. No. 10/042,342 (Attorney Docket No. D/A1333), filed Jan. 11, 2002, titled "POLYTHIOPHENES AND DEVICES THEREOF," which has been published as US Published Application 2003/0160234.

Beng Ong et al., U.S. application Ser. No. 10/042,356 (Attorney Docket No. D/A1334), filed Jan. 11, 2002, titled "POLYTHIOPHENES AND DEVICES THEREOF," which issued as U.S. Pat. No. 6,621,099.

SUMMARY OF THE DISCLOSURE

In embodiments, there is provided an electronic device comprising a semiconductor layer in contact with a number of electrodes, wherein the semiconductor layer includes a small molecular thiophene compound consisting of a plurality of thiophene units, each thiophene unit being represented by structure (A)

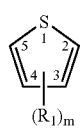

(A)

wherein each thiophene unit is bonded at either or both of the second ring position and the fifth ring position, wherein m is 0, 1, or 2, wherein each thiophene unit is the same or different from each other in terms of substituent number, substituent identity, and substituent position, wherein each $R_1$ is independently selected from the group consisting of:

(a) a hydrocarbon group,
(b) a heteroatom containing group, and
(c) a halogen,
  wherein there is at least one thiophene unit where R$_1$ is present at the third ring position or the fourth ring position, or at both the third ring position and the fourth ring position,
  wherein for any two adjacent thiophene units as represented by structure (A1):

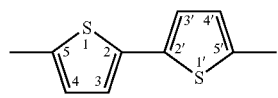

(A1)

there is excluded the simultaneous presence of the same or different R$_1$ at the 3-position of one thiophene unit and at the 3'-position of the other thiophene unit.

In further embodiments, there is provided a composition comprising: a small molecular thiophene compound consisting of a plurality of thiophene units, each thiophene unit being represented by structure (A)

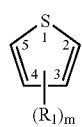

(A)

wherein each thiophene unit is bonded at either or both of the second ring position and the fifth ring position,
wherein m is 0, 1, or 2,
wherein each thiophene unit is the same or different from each other in terms of substituent number, substituent identity, and substituent position,
wherein each R$_1$ is independently selected from the group consisting of:
(a) a hydrocarbon group,
(b) a heteroatom containing group, and
(c) a halogen,
  wherein there is at least one thiophene unit where R$_1$ is present at the third ring position or the fourth ring position, or at both the third ring position and the fourth ring position,
  wherein for any two adjacent thiophene units as represented by structure (A1):

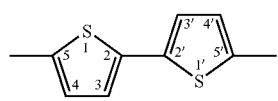

(A1)

there is excluded the simultaneous presence of the same or different R$_1$ at the 3-position of one thiophene unit and at the 3'-position of the other thiophene unit.

In other embodiments, there is provided an electronic device comprising a semiconductor layer in contact with a number of electrodes, wherein the semiconductor layer includes a small molecular thiophene compound consisting of:

at least one divalent linkage; and
a plurality of thiophene units, each thiophene unit being represented by structure (A)

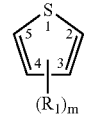

(A)

wherein each thiophene unit is bonded at either or both of the second ring position and the fifth ring position,
wherein m is 0, 1, or 2,
wherein each thiophene unit is the same or different from each other in terms of substituent number, substituent identity, and substituent position,
wherein each R$_1$ is independently selected from the group consisting of:
(a) a hydrocarbon group,
(b) a heteroatom containing group, and
(c) a halogen,
  wherein there is at least one thiophene unit where R$_1$ is present at the third ring position or the fourth ring position, or at both the third ring position and the fourth ring position,
  wherein for any two adjacent thiophene units as represented by structure (A1):

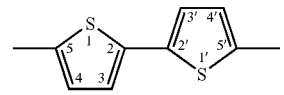

(A1)

there is excluded the simultaneous presence of the same or different R$_1$ at the 3-position of one thiophene unit and at the 3'-position of the other thiophene unit, and
  wherein the number of the thiophene units is at least 6.

In additional embodiments, there is provided a composition comprising a small molecular thiophene compound consisting of:
at least one divalent linkage; and
a plurality of thiophene units, each thiophene unit being represented by structure (A)

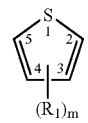

(A)

wherein each thiophene unit is bonded at either or both of the second ring position and the fifth ring position,
wherein m is 0, 1, or 2,
wherein each thiophene unit is the same or different from each other in terms of substituent number, substituent identity, and substituent position,
wherein each R$_1$ is independently selected from the group consisting of:
(a) a hydrocarbon group,
(b) a heteroatom containing group, and
(c) a halogen, wherein there is at least one thiophene unit where $R_1$ is present at the third ring position or the fourth ring position, or at both the third ring position and the fourth ring position, wherein for any two adjacent thiophene units as represented by structure (A1):

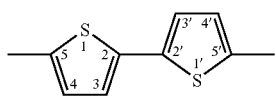

(A1)

there is excluded the simultaneous presence of the same or different $R_1$ at the 3-position of one thiophene unit and at the 3'-position of the other thiophene unit, and wherein the number of the thiophene units is at least 6.

More embodiments include a process comprising:

subjecting a reaction mixture comprising a reaction medium, a coupling agent, and a precursor to a coupling temperature to preferentially form a desired small molecular thiophene compound in a single-step synthesis, wherein the precursor consists of:
(i) an optional divalent linkage, and
(ii) a plurality of thiophene units, each thiophene unit being represented by structure (A)

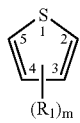

(A)

wherein each thiophene unit is bonded at either or both of the second ring position and the fifth ring position, wherein m is 0, 1, or 2, wherein each thiophene unit is the same or different from each other in terms of substituent number, substituent identity, and substituent position, wherein each $R_1$ is independently selected from the group consisting of:
(a) a hydrocarbon group,
(b) a heteroatom containing group, and
(c) a halogen.

Additional embodiments include a process comprising:

subjecting a reaction mixture comprising a reaction medium, a coupling agent, and a precursor to a coupling temperature to preferentially form a desired small molecular thiophene compound in a single-step synthesis, wherein precipitation in the reaction mixture spontaneously occurs and the precipitate includes the desired small molecular thiophene compound, wherein the precursor consists of:
(i) an optional divalent linkage, and
(ii) a plurality of thiophene units, each thiophene unit being represented by structure (A)

(A)

wherein each thiophene unit is bonded at either or both of the second ring position and the fifth ring position, wherein m is 0, 1, or 2, wherein each thiophene unit is the same or different from each other in terms of substituent number, substituent identity, and substituent position, wherein each $R_1$ is independently selected from the group consisting of:
(a) a hydrocarbon group,
(b) a heteroatom containing group, and
(c) a halogen.

BRIEF DESCRIPTION OF THE DRAWINGS

Other aspects of the present invention will become apparent as the following description proceeds and upon reference to the following figures which represent exemplary embodiments.

Unless otherwise noted, the same reference numeral in different Figures refers to the same or similar feature.

DETAILED DESCRIPTION

Figure 1:
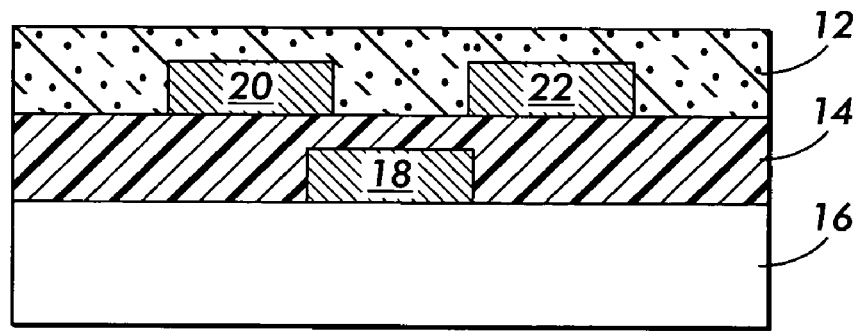
FIG. 1 represents a first embodiment of the present invention in the form of a thin film transistor.

The term "molecular" in "small molecular thiophene compound" indicates that the compound has a specific number (not an average number) of thiophene units. In embodiments, the small molecular thiophene compound has a purity of at least about 90% by weight, or at least about 98% by weight. While impurities (e.g., reaction by-product thiophene compound(s) with a different present, the small molecular thiophene compound remains that of a compound having a specific number, not an average number, of thiophene units. In embodiments, the purity of the small molecular thiophene compound may be described by terms denoting a purity level where exemplary terms are for example "ACS Reagent Grade" (for example ≧95% by weight), "HPLC Grade" (for example ≧99.9% by weight) and "Semiconductor Grade" (for example ≧99.99% by weight). In embodiments, the small molecular thiophene compound has the best obtainable purity. Before isolated from the reaction mixture, the small molecular thiophene compound is referred to as the "desired small molecular thiophene compound."

Unless otherwise noted, both the "small molecular thiophene compound" and the "desired small molecular thiophene compound" are referred herein as the "compound."

The term "small" in "small molecular thiophene compound" and in "desired small molecular thiophene compound" indicates a small number of thiophene units and is intended to distinguish from a structure having a large number of units such as a polymer with many repeating units. In embodiments, the compound has a specific number of thiophene units of structure (A) ranging from about 4 to about 25, or from about 5 to about 20. Values outside these ranges are encompassed by embodiments of the present compound as long as the number of thiophene units in the compound is consistent with the meaning of "small."

The compound described herein is a thiophene derivative and is composed of an optional divalent linkage or linkages and a specific number of thiophene units of structure (A) which are either mono- or divalently bonded to each other, or to the optional divalent linkage, in the compound. Each thiophene unit is of structure (A)

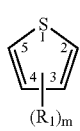

(A)

where $R_1$ is independently selected from a hydrocarbon group, a heteroatom containing group, and a halogen, and where m is 0, 1, or 2.

The small molecular thiophene compound may be prepared by a controlled coupling reaction of a thiophene precursor, which is composed of a number of covalently linked thiophene units of structure (A) and an optional divalent linkage or linkages, to provide a small molecular compound composed of a specific number of thiophene units of structure (A) and the optional divalent linkage or linkages.

In certain embodiments of the compound, for any two adjacent thiophene units within the structure of the compound, there is excluded the simultaneous presence of substituents at the 3, 3' positions, that is to say, no simultaneous substitutions at the third ring positions (3 and 3') of two adjacent thiophene units. In embodiments, molecules of the compound may exhibit extensive pi-conjugation, but the simultaneous presence of substituents at the third ring positions may cause torsional deviation of the two adjacent thiophene units from coplanarity, thus significantly breaking down the pi-conjugation of the molecules. Short pi-conjugation length may lead to short pi-delocalization and thus poor change carrier transport capability and low mobility. It is understood that two thiophene units with an intervening divalent linkage are not considered adjacent. To illustrate the meaning of no simultaneous substitutions at the third ring positions of two adjacent thiophene units, the relevant ring positions of each thiophene unit is identified in a two thiophene segment represented by structure (A1):

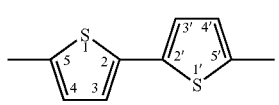

(A1)

where the third ring positions of the thiophene units are identified as 3 and 3'. It is noted that the discussion regarding no simultaneous substitutions at the third ring positions of two adjacent thiophene units does not exclude embodiments where for each thiophene unit in the two thiophene unit segment, $R_1$ forms part of a ring structure attached to the carbon atoms at the third ring position and the fourth ring position of the thiophene unit. The fused cyclic $R_1$ substituent on each of the two adjacent thiophenes may be the same or different from one another. In embodiments, the simultaneous presence of fused cyclic $R_1$ substituents at the third ring positions does not appear to cause significant torsional deviation of the two adjacent thiophene units from coplanarity, thus still capable of maintaining substantial pi-conjugation of the molecules. In structure A1, it is understood that the phrase two adjacent thiophene units also encompasses embodiments where one of the thiophene units is a "terminal" thiophene unit.

Optionally, the compound may contain in its structure one or more divalent linkages such as for example those represented by the following structures:

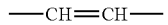 (1)

 (2)

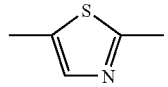 (3)

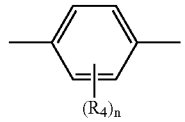 (4)

 (5)

 (6)

wherein n is 0, 1, 2, 3, or 4, and the substituents of $R_4$ are the same or different from each other within each divalent linkage and among different divalent linkages. $R_4$ may be a hydrocarbon group, a heteroatom containing group, and a halogen.

If present, any suitable number of the same or different divalent linkage may be present in the compound such as from 1 to about 5 for the compound.

In embodiments of the compound, regardless whether the two "terminal" thiophene units (i.e., the thiophene unit located at each end of the compound) have any $R_1$ substituent, there is at least one "internal" thiophene unit (i.e., those thiophene units other than the "terminal" thiophene units) where $R_1$ is present at the third ring position or the fourth ring position, or at both the third ring position and the fourth ring position. The presence of the $R_1$ substituent at the "internal" thiophene unit(s) may help induce and facilitate intermolecular interactions through interaction of $R_1$ substituents, and this will allow molecules to self-organize into proper molecular ordering. Proper molecular ordering is conducive to charge carrier transport.

In embodiments of the present invention, one or both of the following aspects are optional:

(a) for the small molecular thiophene compound there is at least one thiophene unit where $R_1$ is present at the third ring position or the fourth ring position, or at both the third ring position and the fourth ring position; and (b) wherein for any two adjacent thiophene units in the small molecular thiophene compound, there is excluded the simultaneous presence of the same or different $R_1$ at the third ring position of one thiophene unit and at the third ring position of the other thiophene unit.

Exemplary compounds without the divalent linkage are for example the following:

(A2)
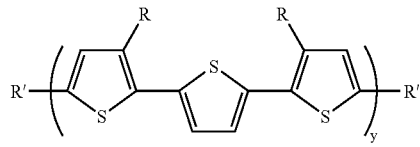

(A3)
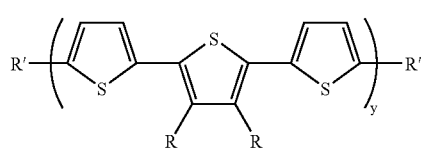

(A4)
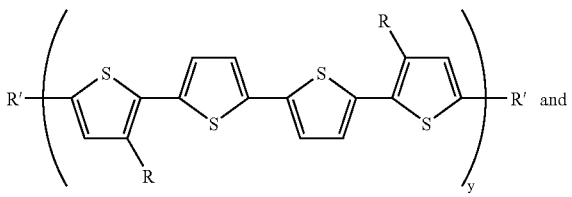
and (A5)
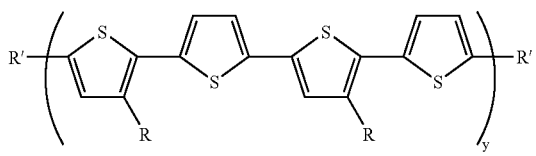

where y, R, and R' are described herein.

In specific embodiments, the compounds can be:

(I)
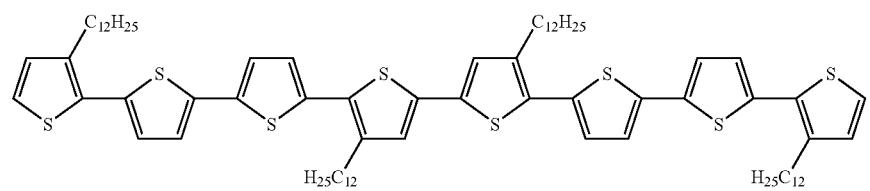

(II)
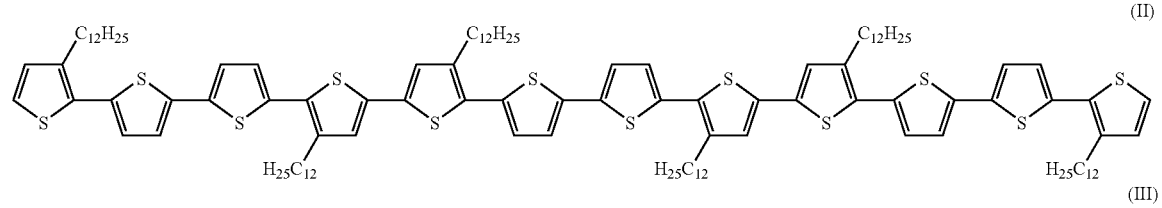

(III)
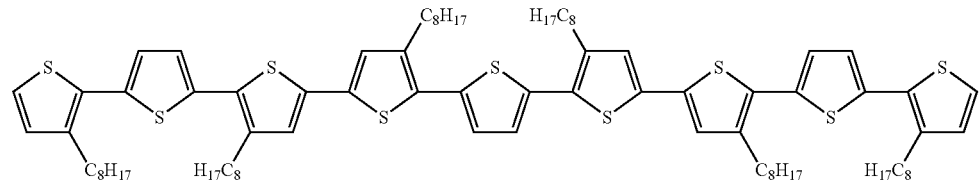

(IV)
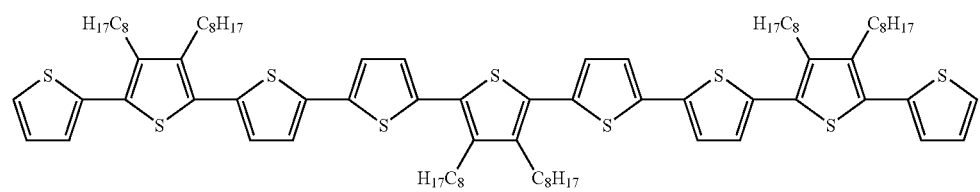

Exemplary compounds with the divalent linkage are for example the following:
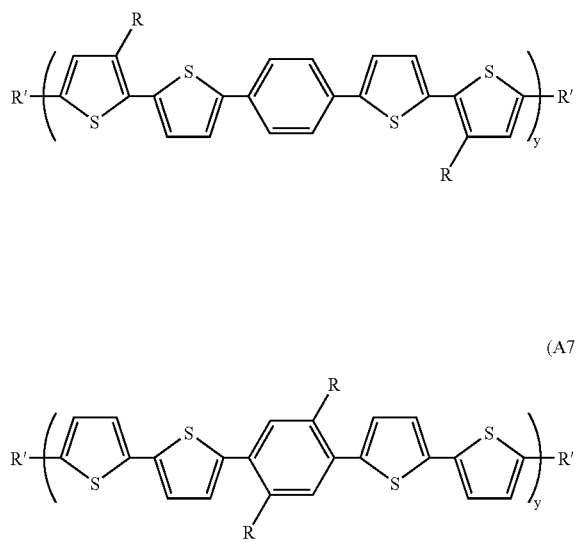
(A6)
(A7)
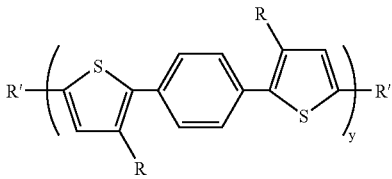
(A8)
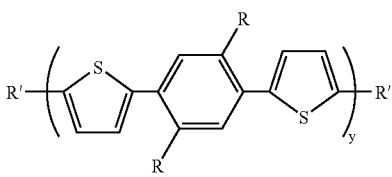
(A9)
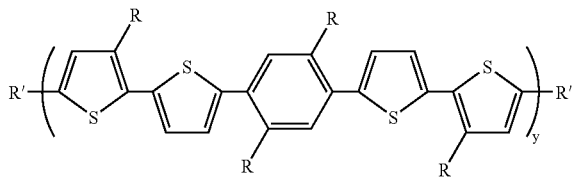
(A10)
where y, R, and R' are described herein.
In specific embodiments, the compounds with the divalent linkage can be:
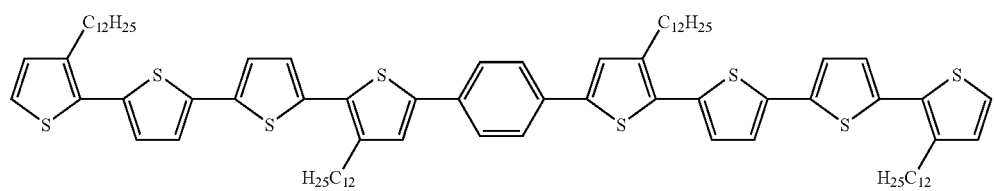
(V)
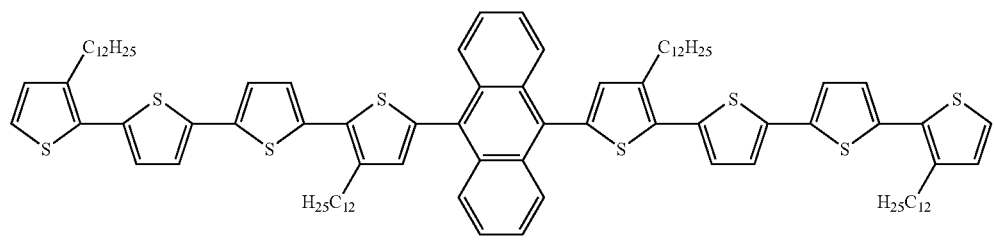
(VI)
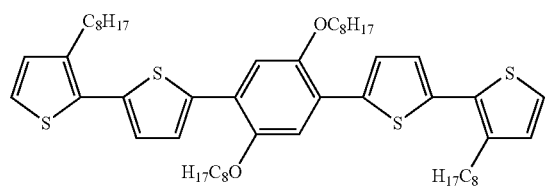
(VII)
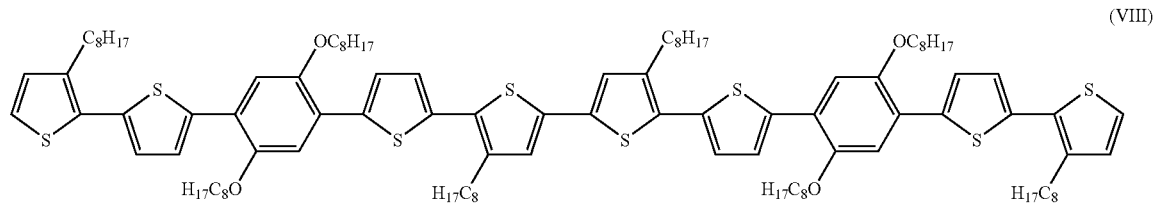
(VIII)

The total number of thiophene units of structure (A) in the compound (the optional divalent linkage may be present) may be an even or odd number and may be for example: at least 4, at least 6, at least 8, at least 10, from 6 to 32, from 8 to 32, from 6 to 20, or from 8 to 20. In embodiments, the number of the thiophene units in the small molecular thiophene compound is selected from the group consisting of 6, 8, 12, and 16. In embodiments, a larger number of thiophene units is preferred because longer pi-conjugation lengths lead to extended pi-delocalization, which is more favorable for charge carrier transport.

The small molecular thiophene compound can be synthesized by any suitable reactions. In embodiments, the small molecular thiophene compound can be synthesized by a coupling reaction of a precursor compound composed of a number of thiophene units of structure (A) and an optional divalent linkage or linkages. Exemplary precursors without the divalent linkage are for example the following:

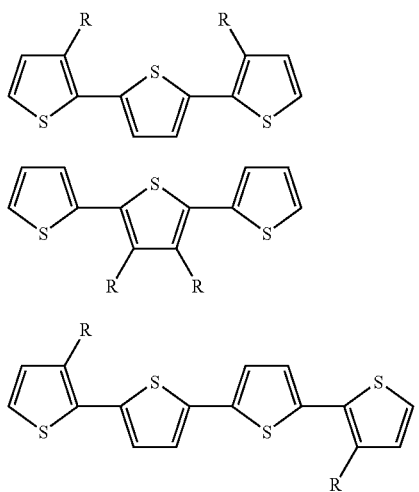

where R is described herein.

Exemplary precursors with the divalent linkage are for example the following:

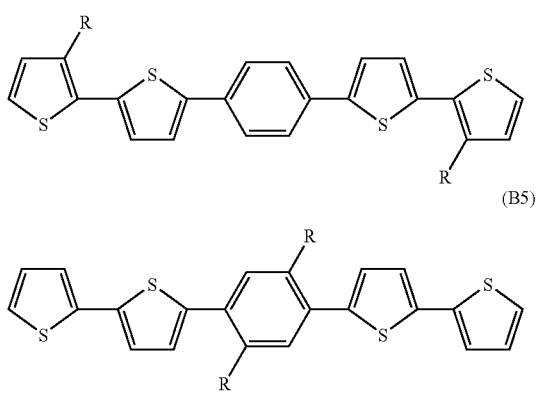

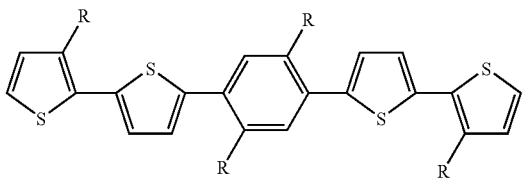

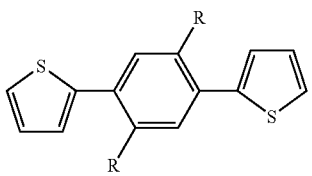

where R is described herein.

The number of thiophene units of structure (A) in the precursor (the optional divalent linkage may be present) may range for example from 2 to 8, 3 to 8, or from 3 to 6.

Possible substituents for all the recited herein, structures (A), (A2) through (A10), and (B1) through (B7) are now discussed in more detail. Unless otherwise noted, the possible substituents apply to all thiophene units in each structure.

Number of Units of y

In embodiments, y is the number of units ranging for example from about 2 to about 6, or from about 2 to about 4.

Substituent R

R and R' are the same or different from each other where R is selected from the group consisting of:
 (a) a hydrocarbon group,
 (b) a heteroatom containing group, and
 (c) a halogen.

Substituent R'

R' is selected from the group consisting of:
 (a) a hydrocarbon group,
 (b) a heteroatom containing group,
 (c) a halogen, and
 (d) a hydrogen.

Hydrocarbon Group for R, R', $R_1$, $R_2$, $R_3$, $R_4$

The hydrocarbon group contains for example from 1 to about 25 carbon atoms, or from 1 to about 10 carbon atoms, and may be for example a straight chain alkyl group, a branched alkyl group, a cycloalkyl group, an aryl group, an alkylaryl group, and an arylalkyl group. Exemplary hydrocarbon groups include for example methyl, ethyl, propyl, butyl, pentyl, hexyl, heptyl, octyl, nonyl, decyl, undecyl, dodecyl, tridecyl, tetradecyl, pentadecyl, cyclopentyl, cyclohexyl, cycloheptyl, and isomers thereof.

The hydrocarbon group is optionally substituted one or more times with for example a halogen (chlorine, bromine, fluorine, and iodine).

Heteroatom Containing Group for R, R', $R_1$, $R_2$, $R_3$, $R_4$

The heteroatom containing group has for example 2 to about 50 atoms, or from 2 to about 30 atoms) and may be for example a nitrogen containing moiety, an alkoxy group, a heterocyclic system, an alkoxyaryl, and an arylalkoxy. Exemplary heteroatom containing groups include for example cyano, nitro, methoxyl, ethoxyl, and propoxy.

$R_1$ is Cyclic Substituent Fused to Thiophene Unit

In embodiments, $R_1$ is part of a cyclic ring structure fused to the thiophene unit, where the fused cyclic ring structure is of any size such as for example a 4 to 8 membered ring, particularly, a 5 or 6 membered ring, wherein $R_1$ is attached at the carbon atoms at the third ring position and the fourth ring position of the thiophene unit. The fused cyclic ring structure (containing $R_1$) may be either a hydrocarbon group described herein or a heteroatom containing group described herein. Where $R_1$ is part of a ring structure fused to a thiophene unit, m is 1 even though $R_1$ in this situation is bonded to two positions of the thiophene unit. Examples of the thiophene unit with $R_1$ being part of a ring substituent structure are the following:

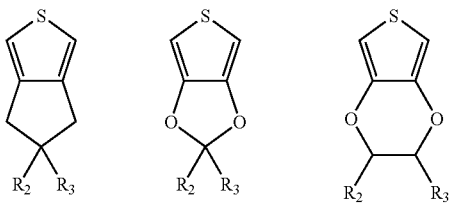

wherein $R_2$ and $R_3$ are the same or different from each other, and are the group consisting of:
(a) a hydrocarbon group,
(b) a heteroatom containing group,
(c) a halogen, and
(d) a hydrogen.

Halogen for R, R', $R_1$, $R_2$, $R_3$, $R_4$

The halogen may be chlorine, bromine, fluorine, and iodine.

The compound is symmetrical or unsymmetrical. The term symmetrical refers to a structure that exhibits a regular repeated pattern of the component parts. The term symmetrical also refers to two component parts of the compound in a plane such that the line segment joining the two component parts is bisected by an axis, a point or a center. On the other hand, unsymmetrical compounds refer to the compounds lacking of the above-mentioned symmetry. An example of a symmetrical compound is an embodiment of compound (A2) where the two R moieties are the same and the two R' moieties are the same. An example of an unsymmetrical compound is an embodiment of compound (A2) where the two R moieties are different or where the two R' moieties are different.

The compound may be a p-type semiconductor compound or a n-type semiconductor compound, depending on the substituents. In general, substituents with electron-donating property such as a hydrocarbon like alkyl, alkyloxy and phenylene groups will make the molecule electron-rich, thus turning the molecule into p-type; while substituents with electron-withdrawing ability such as cyano, nitro, fluoro, and fluorinated alkyl groups will make the thiophene molecule electron-deficient, thus turning the compound into a n-type semiconductor.

In embodiments, a composition composed of two or more of different small molecular thiophene compounds may be used for the fabrication of the semiconductor layers for thin film transistors. In the composition, the small molecular thiophene compounds are physically added together in a predetermined ratio, thus controlling both the number of compounds and their ratio in the composition. In the composition, the different small molecular thiophene compounds may be present in any suitable amounts such as for example ranging from about 5%(first molecular compound):95% (second molecular compound) by weight to 95% (first molecular compound):5% (second molecular compound) by weight. Each small molecular thiophene compound in the composition may be synthesized as described herein.

Preparation of the Compound Via Oxidative Coupling Reaction of Precursor

One exemplary technique to synthesize the compound involves subjecting to a suitable coupling temperature (e.g., an elevated temperature from heating or room temperature) a reaction mixture comprising a reaction medium (a single reaction medium or a mixture of two or more different reaction media in any suitable ratio), a coupling agent (a single coupling agent or a mixture of two more different coupling agents in any suitable ratio), and a precursor (a single precursor or a mixture of two or more different precursors in any suitable ratio). Subjecting the reaction mixture to the coupling temperature causes the precursor to self-couple under the influence of coupling agent, resulting in the preferential formation of the desired small molecular thiophene compound with the desired number of thiophene units in the compound. The phrases "preferential formation" and "preferentially form" indicate that in the reaction mixture after a certain predetermined reaction time, the desired small molecular thiophene compound has the highest concentration by weight compared to any single one of the reaction byproduct thiophene compound(s), where the desired small molecular thiophene compound is present in an amount ranging from about 30% to about 90%, or from about 40% to about 80%, by weight based on the weight of the reaction mixture (in embodiments, these percentages are based on the weight of the precipitate if precipitation occurs). The phrase "reaction byproduct thiophene compound(s)" encompasses any molecules of unreacted precursor and any thiophene compound(s) different from the desired small molecular thiophene compound.

In embodiments, subjecting the reaction mixture to the coupling temperature will within a period of time "spontaneously" cause a precipitate (as observed by the naked eye) to form which includes the desired small molecular thiophene compound and optionally any reaction byproduct thiophene compound(s). The term "spontaneously" means that the precipitate will come out of the reaction medium in due course without the need for any additional procedure(s) to facilitate the precipitation. In other embodiments of the present invention, one or more additional procedure(s) may be optionally undertaken to hasten the precipitation, to increase the amount of precipitate, or to increase the proportion of the desired small molecular thiophene compound in the reaction mixture and/or precipitate, such as by decreasing the solubility of the desired small molecular thiophene compound in the reaction medium by adding a different reaction medium selected for that purpose. Even with the use of these optional additional procedures, the present process is still considered to "spontaneously" cause the precipitate to form since precipitation would occur in the absence of these additional procedures. In other embodiments, no precipitate is formed and the desired small molecular thiophene compound which is formed is soluble in the reaction medium.

In embodiments, the reaction medium and the coupling temperature are selected to cause precipitation "spontaneously" of the desired small molecular thiophene compound when the concentration of the desired small molecular thiophene compound reaches a saturation point in the reaction medium. The saturation point of the desired small molecular thiophene compound is dictated by its solubility in the reaction medium, and thus varies depending on the nature of the desired small molecular thiophene compound, the reaction medium, and the temperature of the reaction medium. Of all the molecules of the desired small molecular thiophene compound in the reaction mixture, all or a portion thereof may precipitate, such as from about 30% to 100% by weight.

The formation of the desired small molecular thiophene compound occurs in a single-step synthesis. The phrase "single-step synthesis" refers to a synthesis route of one reaction in contrast to a "multi-step synthesis" involving two or more reactions to synthesize the desired small molecular thiophene compound. The distinction between "single-step synthesis""and multi-step synthesis" is understood by those of ordinary skill in the art. In embodiments of the "single-step synthesis," an intermediate product may be formed in the reaction mixture where the intermediate product undergoes further reaction in the reaction mixture to form the desired small molecular thiophene compound. In embodiments, one or more additional optional procedures may be undertaken to hasten the precipitation, to increase the amount of precipitate, or to increase the proportion of the desired small molecular thiophene compound in the reaction mixture and/or precipitate, but these additional procedures are not considered a synthesis reaction and thus the present process remains a "single-step synthesis" even with the optional use of these additional procedures. Similarly, any procedures used to isolate the desired small molecular thiophene compound from the reaction mixture or the precipitate are not a synthesis reaction and thus the present process remains a "single-step synthesis" even with the use of isolation procedures.

The coupling temperature can be maintained at the same temperature or varied over time to for example control the proportion of the desired small molecular thiophene compound in the reaction mixture and/or precipitate. The reaction mixture is subjected to the coupling temperature for a time ranging for example from about 10 minutes to about 24 hours, or from about 1 hour to about 5 hours. The coupling temperature ranges for example from about room temperature to about 150 degrees C., or from about 23 to about 150 degrees C., or from about 30 to about 140 degrees C., or from about 50 to about 80 degrees C. As used herein, room temperature refers to a temperature ranging for example from about 23 to about 25 degrees C.

In embodiments, prior to any heating of the reaction mixture, the amount of precursor dissolved in the reaction medium at room temperature may range for example from about 0.001% to about 75% by weight, or from about 0.025% to about 50% by weight, based on the weight of the precursor. The precursor(s) employed may be any of those described herein composed of the thiophene units of structure (A) and the optional divalent linkage. Exemplary concentrations of the precursor are from 0.001% to about 50% by weight, more specifically, 0.025% to about 30% by weight based on the total reaction medium and precursor.

The reaction medium may be for example tetrahydrofuran, toluene, chloroform dichloromethane, chlorobenzene, dichlorobenzene, dichloroethane, 1,2-dichloroethane, xylene, heptane, mesitylene, nitrobenzene, acetonitrile, cyanobenzene, or a mixture thereof. In embodiments, the reaction medium is considered a solvent.

The coupling agent may be for example $FeCl_3$, $RuCl_3$, $MoCl_5$, or a mixture thereof. The molar ratio of coupling agent to precursor is for example from 1:1 to 10:1, particularly 2:1 to 6:1. In embodiments, the coupling agent is an oxidative agent.

The desired small molecular thiophene compound can be isolated from the precipitate using any suitable technique such as by column chromatography.

In embodiments, the desired small molecular thiophene compound stays in solution after its preferential formation in the reaction mixture and does not spontaneously precipitate at the coupling temperature. In such embodiments, the desired small molecular thiophene compound can be isolated from the reaction mixture by any suitable procedures such as for example evaporation of all solvents, addition of poor solvent into the reaction mixture resulting in precipitation of the desired small molecular thiophene compound, extraction with different solvent, and directly running a column chromotrography.

In embodiments, the present invention may be used whenever there is a need for a semiconductor layer in an electronic device. The phrase "electronic device" refers to macro-electronic devices such as solar cell devices and to micro- and nano-electronic devices such as, for example, micro- and nano-sized transistors and diodes. Illustrative transistors include for instance thin film transistors, particularly field effect transistors.

Any suitable techniques may be used to form the semiconductor layer containing the compound. One such method is by vacuum evaporation at a vacuum pressure of about $10^{-5}$ to $10^{-7}$ torr in a chamber containing a substrate and a source vessel that holds the compound in powdered form. Heat the vessel until the compound sublimes onto the substrate. The performance of the films containing the compound depends on the rate of heating, the maximum source temperature and/or substrate temperature during process. In embodiments, solution deposition techniques may also be used to fabricate a thin film containing the compound. The phrase "solution deposition techniques" refers to any liquid deposition technique such as spin coating, blade coating, rod coating, screen printing, ink jet printing, stamping and the like. Specifically, the compound is dissolved in a suitable liquid of for example tetrahydrofuran, dichlorormethane, chlororbenzene, toluene, and xylene at a concentration of about 0.1% to 10%, particularly 0.5% to 5% by weight, followed by spin coating at a speed of about 500 to 3000 rpm, particularly 1000–2000 rpm for a period of time of about 5 to 100 seconds, particularly about 30 to 60 seconds at room temperature or an elevated temperature.

In FIG. 1, there is schematically illustrated a thin film transistor ("TFT") configuration 10 comprised of a substrate 16, in contact therewith a metal contact 18 (gate electrode) and a layer of an insulating layer 14 on top of which two metal contacts, source electrode 20 and drain electrode 22, are deposited. Over and between the metal contacts 20 and 22 is an organic semiconductor layer 12 as illustrated herein.

Figure 2:
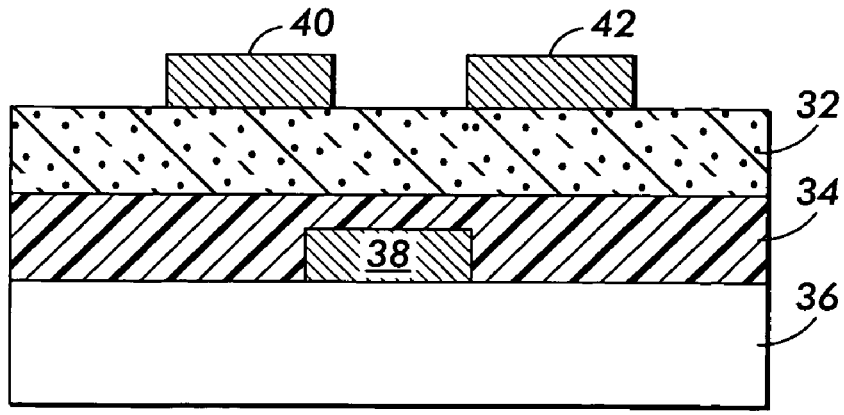
FIG. 2 represents a second embodiment of the present invention in the form of a thin film transistor.

FIG. 2 schematically illustrates another TFT configuration 30 comprised of a substrate 36, a gate electrode 38, a source electrode 40 and a drain electrode 42, an insulating layer 34, and an organic semiconductor layer 32.

Figure 3:
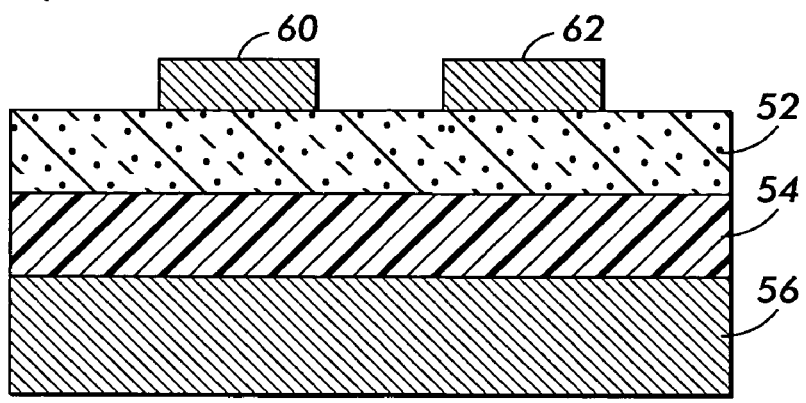
FIG. 3 represents a third embodiment of the present invention in the form of a thin film transistor.

FIG. 3 schematically illustrates a further TFT configuration 50 comprised of a heavily n-doped silicon wafer 56 which acts as both a substrate and a gate electrode, a thermally grown silicon oxide insulating layer 54, and an organic semiconductor layer 52, on top of which are deposited a source electrode 60 and a drain electrode 62.

Figure 4:
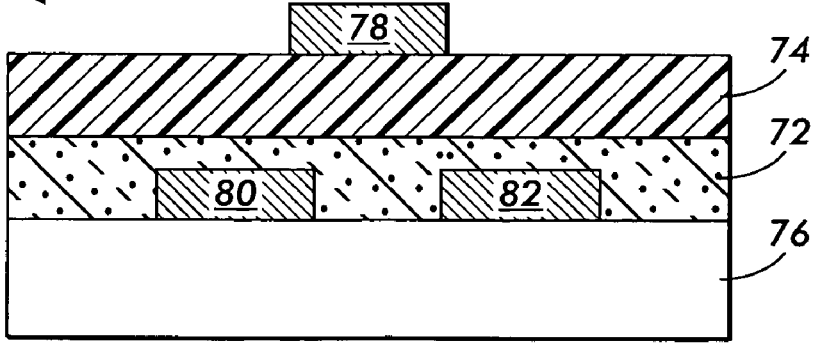
FIG. 4 represents a fourth embodiment of the present invention in the form of a thin film transistor.

FIG. 4 schematically illustrates an additional TFT configuration 70 comprised of substrate 76, a gate electrode 78, a source electrode 80, a drain electrode 82, an organic semiconductor layer 72, and an insulating layer 74.

The composition and formation of the semiconductor layer are described herein.

The substrate may be composed of for instance silicon, glass plate, plastic film or sheet. For structurally flexible devices, plastic substrate, such as for example polyester, polycarbonate, polyimide sheets and the like may be preferred. The thickness of the substrate may be from amount 10 micrometers to over 10 millimeters with an exemplary thickness being from about 50 to about 100 micrometers, especially for a flexible plastic substrate and from about 1 to about 10 millimeters for a rigid substrate such as glass or silicon.

The compositions of the gate electrode, the source electrode, and the drain electrode are now discussed. The gate electrode can be a thin metal film, a conducting polymer film, a conducting film made from conducting ink or paste or the substrate itself, for example heavily doped silicon. Examples of gate electrode materials include but are not restricted to aluminum, gold, chromium, indium tin oxide, conducting polymers such as polystyrene sulfonate-doped poly(3,4-ethylenedioxythiophene) (PSS-PEDOT), conducting ink/paste comprised of carbon black/graphite or colloidal silver dispersion in polymer binders, such as ELECTRODAG™ available from Acheson Colloids Company. The gate electrode layer can be prepared by vacuum evaporation, sputtering of metals or conductive metal oxides, coating from conducting polymer solutions or conducting inks by spin coating, casting or printing. The thickness of the gate electrode layer ranges for example from about 10 to about 200 nanometers for metal films and in the range of about 1 to about 10 micrometers for polymer conductors. The source and drain electrode layers can be fabricated from materials which provide a low resistance ohmic contact to the semiconductor layer. Typical materials suitable for use as source and drain electrodes include those of the gate electrode materials such as gold, nickel, aluminum, platinum, conducting polymers and conducting inks. Typical thicknesses of source and drain electrodes are about, for example, from about 40 nanometers to about 1 micrometer with the more specific thickness being about 100 to about 400 nanometers.

The insulating layer generally can be an inorganic material film or an organic polymer film. Illustrative examples of inorganic materials suitable as the insulating layer include silicon oxide, silicon nitride, aluminum oxide, barium titanate, barium zirconium titanate and the like; illustrative examples of organic polymers for the insulating layer include polyesters, polycarbonates, poly(vinyl phenol), polyimides, polystyrene, poly(methacrylate)s, poly(acrylate)s, epoxy resin and the like. The thickness of the insulating layer is, for example from about 10 nanometers to about 500 nanometers depending on the dielectric constant of the dielectric material used. An exemplary thickness of the insulating layer is from about 100 nanometers to about 500 nanometers. The insulating layer may have a conductivity that is for example less than about $10^{-12}$ S/cm.

In embodiments, the insulating layer, the gate electrode, the semiconductor layer, the source electrode, and the drain electrode are formed in any sequence with the gate electrode and the semiconductor layer both contact the insulating layer, and the source electrode and the drain electrode both contact the semiconductor layer. The phrase "in any sequence" includes sequential and simultaneous formation. For example, the source electrode and the drain electrode can be formed simultaneously or sequentially. The composition, fabrication, and operation of field effect transistors are described in Bao et al., U.S. Pat. No. 6,107,117, the disclosure of which is totally incorporated herein by reference.

The semiconductor layer has a thickness ranging for example from about 10 nanometers to about 1 micrometer with a preferred thickness of from about 20 to about 200 nanometers. The TFT devices contain a semiconductor channel with a width W and length L. The semiconductor channel width may be, for example, from about 1 micrometers to about 5 millimeters, with a specific channel width being about 5 micrometers to about 1 millimeter. The semiconductor channel length may be, for example, from about 1 micrometer to about 1 millimeter with a more specific channel length being from about 5 micrometers to about 100 micrometers.

The source electrode is grounded and a bias voltage of generally, for example, about 0 volt to about −80 volts is applied to the drain electrode to collect the charge carriers transported across the semiconductor channel when a voltage of generally about +20 volts to about −80 volts is applied to the gate electrode.

Regarding electrical performance characteristics, a semiconductor layer of the present electronic device has a carrier mobility greater than for example about $10^{-3}$ cm$^2$/Vs (centimeters$^2$/Volt-second) and a conductivity less than for example about $10^{-4}$ S/cm (Siemens/centimeter). The thin film transistors produced by the present process have an on/off ratio greater than for example about $10^3$ at 20 degrees C. The phrase on/off ratio refers to the ratio of the source-drain current when the transistor is on to the source-drain current when the transistor is off.

The invention will now be described in detail with respect to specific exemplary embodiments thereof, it being understood that these examples are intended to be illustrative only and the invention is not intended to be limited to the materials, conditions, or process parameters recited herein. All percentages and parts are by weight unless otherwise indicated. Where provided in the Examples, the NMR spectra were recorded at room temperature using a Bruker DPX 300 NMR spectrometer

EXAMPLE 1

(i) Synthesis of Small Molecular Thiophene Compound (I)

The preparation of precursor, 5,5'-bis(3-dodecyl-2-thienyl)-2,2'-dithiophene, (10), is illustrated in Scheme 1.

Scheme 1 (where R is $C_{12}H_{25}$):

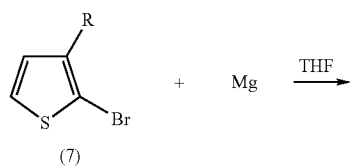

-continued

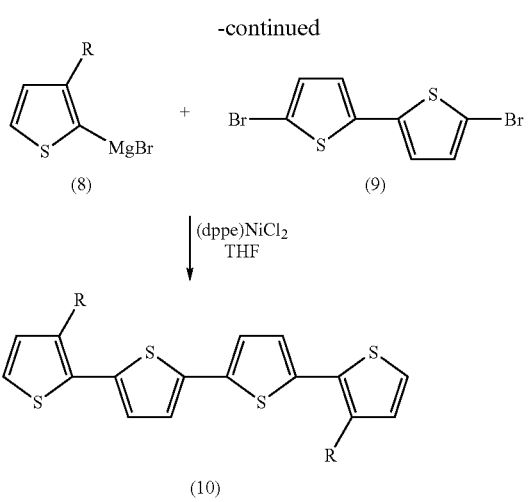

A solution of 2-bromo-3-dodecylthiophene (15.36 grams, 46.36 mmol) in 40 milliliters of anhydrous tetrahydrofuran (THF) was added slowly over a period of 20 minutes to a mechanically stirred suspension of magnesium turnings (1.69 grams, 69.50 mmol) in 5 milliliters of anhydrous THF in a 250 milliliter round-bottomed flask under an inert argon atmosphere. When reaction was initiated, the reaction mixture was stirred at 60° C. for 3 hours before cooling down to room temperature. The resultant mixture was then added via a cannula to a mixture of 5,5'-dibromo-2,2'-dithiophene (6.01 grams, 18.54mmol) and [1,2-bis(diphenylphosphino) ethane]dichloronickel (II) (0.37 gram of (dppe)NiCl$_2$, 0.70 mmol) in 80 milliliters of anhydrous THF in a 250 milliliter round-bottomed flask under an argon atmosphere, and then refluxed for 48 hours. Subsequently, the reaction mixture was cooled down to room temperature and washed with water. The crude product was extracted with ethyl acetate and dried with anhydrous sodium sulfate. A dark brown syrup, obtained after evaporation of the solvent, was purified by column chromotography on silica gel to yield crude 5,5'-bis(3-dodecyl-2-thienyl)-2,2'-dithiophene (10), which was recrystallized from a mixture of dichloromethane(10 ml), isopropanol(250 ml) and methanol (100 ml), yielding a yellow crystalline product in 66 percent yield, m.p. 58.9° C.

The NMR spectrum of the above obtained compound was recorded at room temperature using a Bruker DPX 300 NMR spectrometer:

$^1$H NMR (CDCl$_3$): δ 7.18 (d, J=5.4 Hz, 2H), 7.13 (d, J=3.6 Hz, 2H), 7.02 (d, J=3.6 Hz, 2H), 6.94 (d, J=5.4 Hz, 2H), 2.78 (t, 4H), 1.65 (q, 1.65, 4H), 1.28(bs, 36H), 0.88 (m, 6H). $^{13}$C NMR (CDCl$_3$ ppm): δ 139.78, 136.73, 135.26, 130.26, 129.99, 126.43, 123.75, 123.71, 31.86, 30.59, 29.62, 29.61, 29.54, 29.46, 29.40, 29.30, 29.20, 22.63, 14.05.

The oxidative coupling reaction of precursor (10) to give Compound (I) was conducted as follows: A solution of precursor (10) in 5 ml chlorobenzene was added slowly to a mixture of 0.4 g of FeCl$_3$ and 2 milliliters of chloroform in a 50-milliliter reaction flask. The resulting mixture was stirred at 40° C. for 1 hour, then at room temperature for 16 hours, and finally at 50° C. for 7 hours. After the reaction mixture was cooled down to the room temperature, it was poured into 50 milliliter of dichloromethane, and washed with water. The organic phase was separated and stirred with 200 milliliters of aqueous 7.5% ammonia solution for 30 min. The organic phase was washed again with water and then poured into stirring methanol. The precipitated product was collected by filtration and dried under vacuo at room temperature overnight. Compound (I) was isolated from the crude product by column chromatography on silica gel using an eluent solvent system consisting of 95:5 of hexane: methylene chloride by volume, and recrystallized from isopropanol as a red crystal in 52% yield, m.p., 78.7° C.

$^1$H-NMR(CDCl$_3$, ppm) δ 7.21–6.95(m, 14H), δ 2.83–2.76 (m, 8H), δ 1.77–1.60 (m, 8H), 1.50–1.14 (bs, 72H), 0.97–0.85 (m, 12H). $^{13}$C NMR (CDCl$_3$, ppm): δ 140.98, 140.32, 137.23, 137.09, 135.84, 135.36, 135.27, 130.53, 129.89, 127.02, 126.94, 126.74, 124.28, 32.33, 31.07, 30.86, 30.10, 30.08, 30.01, 29.93, 29.87, 29.77, 29.68, 23.10, 14.53.

(ii) Device Fabrication and Evaluation

A bottom-contact thin-film transistor structure as schematically illustrated by FIG. 1, was used as the test device configuration. The test device was comprised of a series of photolithographically pre-patterned transistor dielectric layers and electrodes with defined channel widths and lengths on a glass substrate. The gate electrode was comprised of chromium of about 80 nanometers in thickness. The insulating layer was a 300 nanometers thick silicon nitride having a capacitance of about 22 nF/cm$^2$ (nanofarads/square centimeter). On top of said insulating layer were coated by vacuum deposition the source and drain contacts comprised of gold of about 100 nanometers in thickness. The semiconductor layer of about 50 nanometers to 100 nanometers in thickness was then deposited by spin coating a 1 wt % chloroform solution of compound (I). The spin coating was accomplished at a spinning speed of 1,000 rpm for about 35 seconds. The resulting coated device was dried in vacuo at 60° C. for 20 hours, and was then ready for evaluation.

The evaluation of transistor performance was accomplished in a black box at ambient conditions using a Keithley 4200 SCS semiconductor characterization system. The carrier mobility, μ, was calculated from the data in the saturated regime (gate voltage, V$_G$<source-drain voltage, V$_{SD}$) accordingly to equation (1)

$$I_{SD} = C_i\mu(W/2L)(V_G - V_T)^2 \qquad (1)$$

where I$_{SD}$ is the drain current at the saturated regime, W and L are, respectively the semiconductor channel width and length, C$_i$ is the capacitance per unit area of the insulating layer, and V$_G$ and V$_T$ are respectively the gate voltage and threshold voltage. V$_T$ of the device was determined from the relationship between the square root of I$_{SD}$ at the saturated regime and V$_G$ of the device by extrapolating the measured data to I$_{SD}$=0.

An important property for the thin film transistor is its current on/off ratio, which is the ratio of the source-drain current in accumulation regime to the source-drain current in depletion regime.

At least five thin-film transistors were prepared with dimensions of W=1,000 μm and L=5 μm. The following properties were obtained:

Mobility: 1.0–4.5×10$^{-3}$ cm$^2$/V.s
Current On/off ratio 10$^2$–10$^4$.

EXAMPLE 2

(i) Synthesis of Small Molecular Thiophene Compound (II)

A solution of 0.5 g of precursor (10) as prepared in Example 1 in 15 milliliters of chloroform was added to a mixture of 0.5 g of FeCl$_3$ and 5 milliliters of chloroform in a 100-milliliter reaction flask. The reaction mixture was stirred at 40° C. for 6 hours, during which time the viscosity of the reaction mixture was observed to increase due to precipitation of reaction product. Subsequently, the reaction mixture was stirred at room temperature for 42 hours, and then diluted with 100 milliliters of dichloromethane and washed with water. The organic phase was separated and stirred with 150 milliliters of aqueous 7.5% ammonia solution for 30 min. The mixture was then washed with water and poured into in 500 milliliters of stirring methanol. The precipitated product was purified by Soxhlet extraction with methylene chloride and then precipitated from methanol, separated by filtration and dried in vacuo at room temperature overnight. Compound (II) was isolated from the crude product by column chromatography on silica gel using an eluent solvent system consisting of 95:5 of hexane:methylene chloride by volume, and further purified by recrystallized from isopropanol as a purple red crystal in 40% yield, m.p., 67.2° C.

was then deposited on top of the silicon oxide dielectric layer by spin coating a 2 wt % solution of the compound (II) in chloroform at a speed of 1,000 rpm for about 35 seconds, and dried in vacuo at 60° C. for 20 hours.

The devices were evaluated according to the procedure of Example 1. At least five thin-film transistors were prepared with dimensions of W=5,000 μm and L=90 μm. The following properties were obtained:

Mobility: $0.9$–$3.2 \times 10^{-3}$ cm$^2$/V.s
Current On/off ratio: $10^3$–$10^4$.

EXAMPLE 3

(i) Synthesis of Small Molecular Thiophene Compound (V)

Compound (V) was prepared according to the synthetic route depicted in Scheme 2:

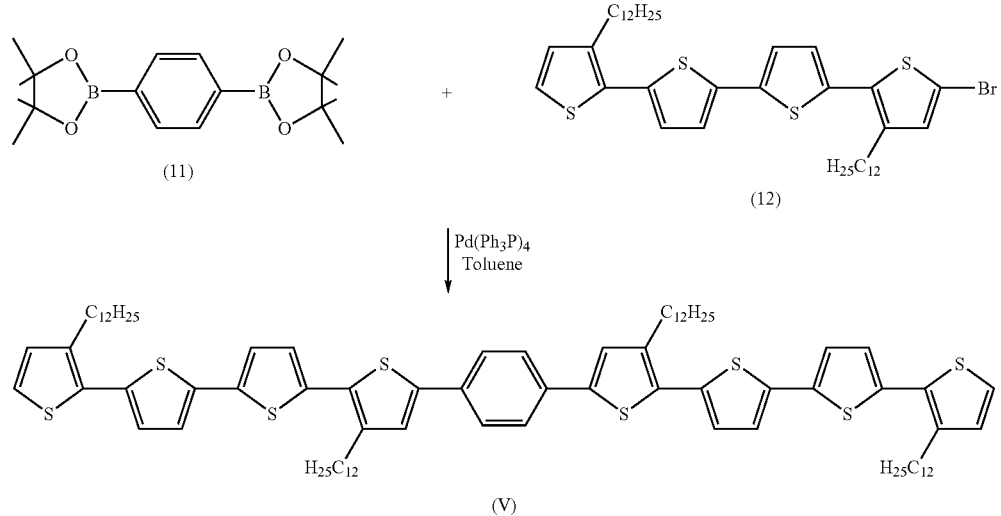

(V)

$^1$H-NMR(CDCl$_3$, ppm) δ 7.21–6.96 (m, 20), δ 2.83–2.77 (m, 12H), δ 1.80–1.60 (m, 12H), 1.50–1.20(bs,108H), 0.92–0.85(t,18H).

$^{13}$C NMR (CDCl$_3$, ppm): δ 141.00, 140.31, 137.23, 137.09, 135.84, 135.48 135.36, 135.30, 135.26, 130.70, 130.52, 129.91, 129.88, 127.03, 126.94, 126.73, 124.37, 124.30, 124.28, 32.34, 31.07, 30.86, 30.09, 30.02, 29.96, 29.94, 29.88, 29.78, 29.69, 23.11, 14.54.

(ii) Device Fabrication and Evaluation

A top-contact thin-film transistor structure, as schematically illustrated by FIG. 3, was used as the test device configuration. The device was comprised of a n-doped silicon wafer with a thermally grown silicon oxide layer of a thickness of about 110 nanometers thereon. The wafer functioned as the gate electrode while the silicon oxide layer acted as the gate dielectric and had a capacitance of about 32 nF/cm$^2$ (nanofarads/square centimeter). The silicon wafer was first cleaned with argon plasma, methanol, air dried, and then immersed in a 0.1 M solution of 1,1,1,3,3,3-hexamethyldisilazane in toluene for about 10 minutes at room temperature. Subsequently, the wafer was washed with toluene, methanol and air-dried. The test semiconductor layer of about 30 nanometers to about 100 nanometers in thickness To a mixture of 1,4-benzenebis(pinacolboronate), (11) (0.1092 g, 0.331 mmol) and monobromo-5,5'-bis(3-dodecyl-2-thienyl)-2,2'-dithiophene, (12) (0.5160, 0.692 mmol) in toluene (20 ml) under an argon atmosphere, were added tetrakis(triphenylphosphine)-palladium (0.020 g, 0.017 mmol), Aliquat336 (0.2g in 5 milliliters of toluene) and 2M aqueous sodium carbonate (2 milliliters, 4 mmol). The mixture was then stirred at 100° C. for 24 hours. After the reaction, the mixture was diluted with toluene (100 milliliters), washed with water, and dried with MgSO$_4$. The solvent was removed and the crude product (V) was isolated by column chromatography on silica gel using an eluent solvent system consisting of 80:20 of hexane:methylene chloride by volume, and further purified by crystallization from hexane and dichloromethane (50:50 by vol.), yielding an orange crystal in 71% yield, m.p., 90.80° C.

$^1$H-NMR(CDCl$_3$, ppm): δ 7.25–6.90 (m, 14H), δ 2.83–2.76 (m, 8H), δ 1.75–1.60 (m, 8H), 1.41–1.20 (bs, 72H), 0.89–0.81 (t, 12H).

$^{13}$C NMR (CDCl$_3$, ppm): δ 141.79, 141.27, 140.31, 137.19, 137.14, 135.81 135.62, 135.50, 133.50, 130.70, 130.50, 126.94, 126.74, 126.61, 126.62, 124.30, 124.27, 32.34, 31.07, 30.97, 30.08, 30.02, 29.94, 29.88, 29.88, 29.78, 29.68, 23.11, 14.53.

(ii) Device Fabrication and Evaluation

A bottom-contact thin-film transistor test structure as described in Example 1 was used with the exception that Compound (V) was used instead of Compound (I). The devices were first dried in vacuum oven at 60° C. for 20 hours, and then evaluated. At least five thin-film transistors were prepared with dimensions of W=1,000 μm and L=5 μm. The following properties were obtained:

Mobility: $0.7$–$1.6 \times 10^{-3}$ cm$^2$/V.s
Current on/off ratio: $10^2$–$10^3$.

The invention claimed is:

1. A process comprising:
   subjecting a reaction mixture comprising a reaction medium, a coupling agent, and a precursor to a coupling temperature to preferentially form a desired small molecular thiophene compound in a single-step synthesis,
   wherein the precursor consists of:
   (i) an optional divalent linkage, and
   (ii) a plurality of thiophene units, each thiophene unit being represented by structure (A)

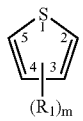

(A)

wherein each thiophene unit is bonded at either or both of the second ring position and the fifth ring position,
wherein m is 0, 1, or 2,
wherein each thiophene unit is the same or different from each other in terms of substituent number, substituent identity, and substituent position,
wherein each R$_1$ is independently selected from the group consisting of:
   (a) a hydrocarbon group,
   (b) a heteroatom containing group, and
   (c) a halogen.

2. The process of claim 1, further including isolating the desired small molecular thiophene compound to result in a small molecular thiophene compound.

3. The process of claim 1, wherein for the small molecular thiophene compound there is at least one thiophene unit where R$_1$ is present at the third ring position or the fourth ring position, or at both the third ring position and the fourth ring position, and
   wherein for any two adjacent thiophene units as represented by structure (A1):

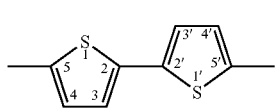

(A1)

there is excluded the simultaneous presence of the same or different R$_1$ at the 3-position of one thiophene unit and at the 3'-position of the other thiophene unit.

4. The process of claim 1, wherein the precipitation in the reaction mixture commences when the concentration of the desired small molecular thiophene compound reaches a saturation point in the reaction medium.

5. The process of claim 1, wherein the desired small molecular thiophene compound is preferentially formed in an amount ranging from about 30% to about 90% by weight.

6. The process of claim 1, wherein the coupling temperature ranges from about room temperature to about 150 degrees C.

7. The process of claim 1, wherein the coupling temperature ranges from about 30 to about 140 degrees C.

8. The process of claim 1, wherein the reaction medium is tetrahydrofuran, toluene, chloroform dichloromethane, chlorobenzene, 1,2-dichloroethane, xylene, heptane, mesitylene, nitrobenzene, acetonitrile, or cyanobenzene, or a mixture thereof.

9. The process of claim 1, wherein the coupling agent is FeCl$_3$, RuCl$_3$, MoCl$_5$, or a mixture thereof.

10. The process of claim 1, wherein the number of the thiophene units in the precursor ranges from 2 to 8.

11. The process of claim 1, wherein the number of the thiophene units in the small molecular thiophene compound is selected from the group consisting of 6, 8, 12, and 16.

12. The process of claim 1, wherein the precursor is selected from the group consisting of:

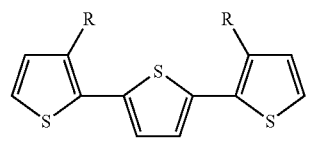

(B1)

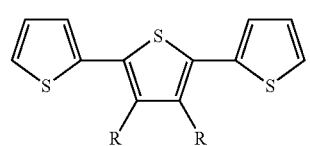

(B2)

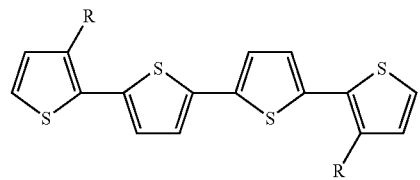

(B3)

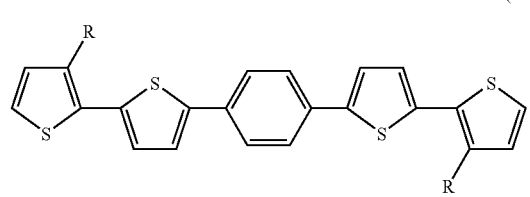

(B4)

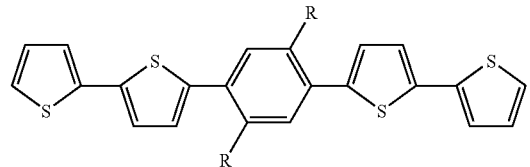

(B5)

-continued (B6)

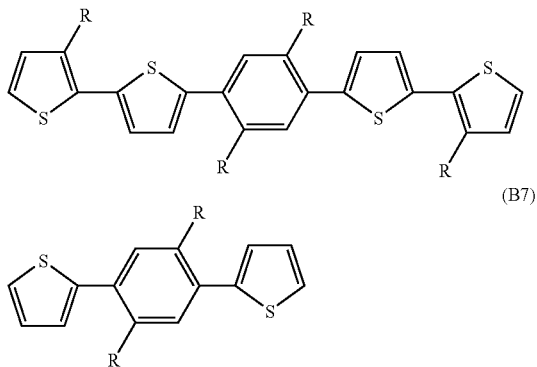

(B7)

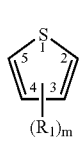

or a mixture thereof, wherein each R is independently selected from the hydrocarbon group, the heteroatom containing group, and the halogen.

13. A process comprising:

subjecting a reaction mixture comprising a reaction medium, a coupling agent, and a precursor to a coupling temperature to preferentially form a desired small molecular thiophene compound in a single-step synthesis, wherein precipitation in the reaction mixture spontaneously occurs and the precipitate includes the desired small molecular thiophene compound, wherein the precursor consists of:
(i) an optional divalent linkage, and
(ii) a plurality of thiophene units, each thiophene unit being represented by structure (A)

(A)

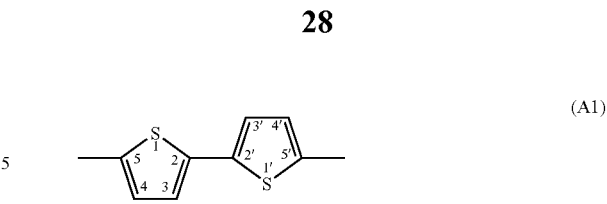

wherein each thiophene unit is bonded at either or both of the second ring position and the fifth ring position,
wherein m is 0, 1, or 2,
wherein each thiophene unit is the same or different from each other in terms of substituent number, substituent identity, and substituent position,
wherein each $R_1$ is independently selected from the group consisting of:
(a) a hydrocarbon group,
(b) a heteroatom containing group, and
(c) a halogen.

14. The process of claim 13, further including isolating the desired small molecular thiophene compound to result in a small molecular thiophene compound.

15. The process of claim 13, wherein for the small molecular thiophene compound there is at least one thiophene unit where $R_1$ is present at the third ring position or the fourth ring position, or at both the third ring position and the fourth ring position, and
wherein for any two adjacent thiophene units as represented by structure (A1):

(A1)

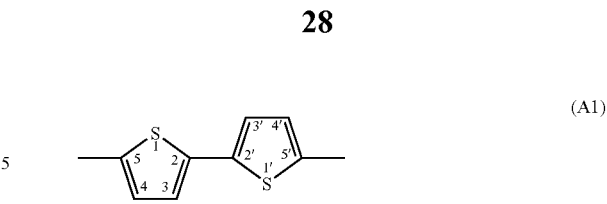

there is excluded the simultaneous presence of the same or different $R_1$ at the 3-position of one thiophene unit and at the 3'-position of the other thiophene unit.

16. The process of claim 13, wherein the precipitation in the reaction mixture commences when the concentration of the desired small molecular thiophene compound reaches a saturation point in the reaction medium.

17. The process of claim 13, wherein the desired small molecular thiophene compound is preferentially formed in an amount ranging from about 30% to about 90% by weight.

18. The process of claim 13, wherein the coupling temperature ranges from about room temperature to about 150 degrees C.

19. The process of claim 13, wherein the coupling temperature ranges from about 30 to about 140 degrees C.

20. The process of claim 13, wherein the reaction medium is tetrahydrofuran, toluene, chloroform dichloromethane, chlorobenzene, 1,2-dichloroethane, xylene, heptane, mesitylene, nitrobenzene, acetonitrile, or cyanobenzene, or a mixture thereof.

21. The process of claim 13, wherein the coupling agent is $FeCl_3$, $RuCl_3$, $MoCl_5$, or a mixture thereof.

22. The process of claim 13 wherein the number of the thiophene units in the precursor ranges from 2 to 8.

23. The process of claim 13, wherein the number of the thiophene units in the small molecular thiophene compound is selected from the group consisting of 6, 8, 12, and 16.

24. The process of claim 13, wherein the precursor is selected from the group consisting of:

(B1)

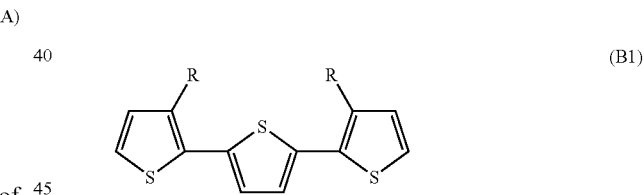

(B2)

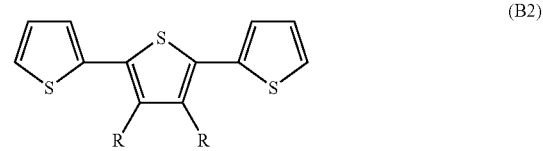

(B3)

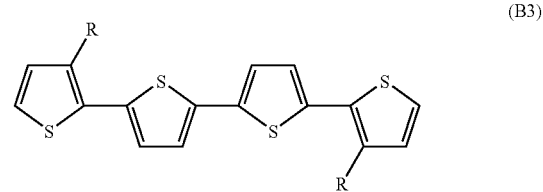

(B4)

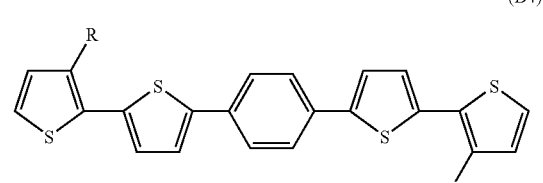

-continued
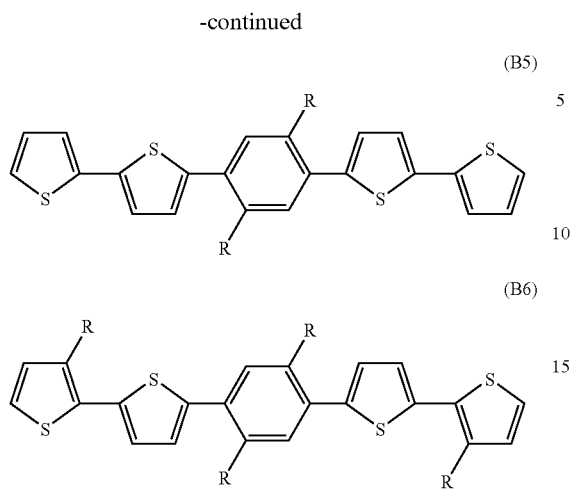
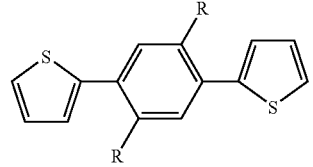
or a mixture thereof,
wherein each R is independently selected from the hydrocarbon group, the heteroatom containing group, and the halogen.
* * * * *

UNITED STATES PATENT AND TRADEMARK OFFICE
CERTIFICATE OF CORRECTION

| | | |
|---|---|---|
| PATENT NO. | : 7,102,017 B2 | Page 1 of 1 |
| APPLICATION NO. | : 10/865029 | |
| DATED | : September 5, 2006 | |
| INVENTOR(S) | : Ping Liu et al. | |

It is certified that error appears in the above-identified patent and that said Letters Patent is hereby corrected as shown below:

In the Specification
Column 1, lines 8 and 9, after "Cooperative Agreement No.", please delete "70NANBOH3033" and insert --70NANB0H3033--.

Signed and Sealed this
Fourteenth Day of January, 2014

Michelle K. Lee
*Deputy Director of the United States Patent and Trademark Office*